(12) United States Patent
Hirano et al.

(10) Patent No.: US 6,692,818 B2
(45) Date of Patent: Feb. 17, 2004

(54) METHOD FOR MANUFACTURING CIRCUIT BOARD AND CIRCUIT BOARD AND POWER CONVERSION MODULE USING THE SAME

(75) Inventors: Koichi Hirano, Hirakata (JP); Yoshihisa Yamashita, Kyoto (JP); Seiichi Nakatani, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/163,806

(22) Filed: Jun. 5, 2002

(65) Prior Publication Data

US 2002/0187321 A1 Dec. 12, 2002

(30) Foreign Application Priority Data

Jun. 7, 2001 (JP) ........................................ 2001-173032

(51) Int. Cl.⁷ ................................................. B32B 3/00
(52) U.S. Cl. ......................... 428/209; 174/258; 428/901
(58) Field of Search ........................... 428/209; 174/258

(56) References Cited

U.S. PATENT DOCUMENTS

| | | | | |
|---|---|---|---|---|
| 4,668,532 A | * | 5/1987 | Moisan et al. | 427/97 |
| 4,786,528 A | * | 11/1988 | Amelio et al. | 427/289 |
| 5,382,333 A | * | 1/1995 | Ando et al. | 156/81 |
| 5,439,986 A | * | 8/1995 | Hosogane et al. | 525/423 |
| 5,652,042 A | * | 7/1997 | Kawakita et al. | 428/209 |
| 5,670,250 A | * | 9/1997 | Sanville, Jr. et al. | 428/323 |
| 5,888,627 A | * | 3/1999 | Nakatani | 428/209 |
| 6,060,150 A | | 5/2000 | Nakatani et al. | |
| 6,214,455 B1 | * | 4/2001 | Honda et al. | 428/299.4 |
| 6,355,131 B1 | * | 3/2002 | Nakatani et al. | 156/252 |
| 6,524,717 B1 | * | 2/2003 | Takano et al. | 428/450 |

FOREIGN PATENT DOCUMENTS

| | | |
|---|---|---|
| JP | 10-173097 A | 6/1998 |
| JP | 11-12543 A | 1/1999 |

* cited by examiner

*Primary Examiner*—Cathy Lam
(74) *Attorney, Agent, or Firm*—Merchant & Gould, P.C.

(57) ABSTRACT

A method for manufacturing a circuit board with high thermal dissipation includes the following steps: preparing a thermal conductive resin composition including 70 to 95 mass % of an inorganic filler and 5 to 30 mass % of a resin composition that includes a liquid thermosetting resin, a thermoplastic resin powder, and a latent curing agent; bonding the thermal conductive resin composition and a metal foil together by heating at a temperature lower than a temperature at which the thermosetting resin starts to cure while applying pressure so that the thermal conductive resin composition increases in viscosity and thus is solidified irreversibly; providing holes and curing the thermosetting resin to form an insulating substrate; and forming through holes and a circuit pattern. This method can achieve improved productivity and low cost in processing the holes. It is preferable that the thermal conductive resin composition is integral with a reinforcing material.

7 Claims, 5 Drawing Sheets

METHOD FOR MANUFACTURING CIRCUIT BOARD AND CIRCUIT BOARD AND POWER CONVERSION MODULE USING THE SAME

BACKGROUND OF THE INVENTION

1. Field of the Invention

The present invention relates to a circuit board used in electrical and electronic equipment and a method for manufacturing the same. In particular, the present invention relates to a method for manufacturing a circuit board suitable for a power electronics field that uses a relatively large current.

2. Description of the Related Art

In recent years, the improvement in density and function of a semiconductor or the like has been emphasized with a demand for high performance and miniaturization of electronic equipment. This leads to a need for a small high-density circuit board, on which the semiconductor or the like is mounted. Thus, an important design consideration is thermal dissipation of the circuit board. To improve the thermal dissipation, a circuit board that can increase the thermal conductivity of an insulating substrate and suppress a local temperature rise better than a conventional printed circuit board made of glass-epoxy resin is desired. A metal-based circuit board is known to have higher thermal conductivity than that of the glass-epoxy resin. The metal-based circuit board includes a metal plate of copper or aluminum and a circuit pattern formed on one surface of the metal plate via an insulating layer. However, it is difficult to reduce the size and weight of the metal-based circuit board because the metal plate has a relatively large thickness. Moreover, the insulating layer should be made thinner to enhance the thermal conductivity of the circuit board, causing the problems of decreasing a withstand voltage and increasing a stray capacitance. A ceramic substrate and a glass-ceramic substrate have higher thermal conductivity than that of the glass-epoxy substrate. However, they use metal powder or a material obtained by firing the metal powder as a conductive material. Therefore, the wiring resistance becomes relatively high, which increases loss and Joule heat generated in using a large current.

A circuit board with high thermal conductivity that can solve the above problems and be manufactured in a similar process to that of a conventional glass-epoxy substrate is disclosed, e.g., in JP 10-173097A. FIGS. 7A to 7D show a method for manufacturing the thermal conductive circuit board. A slurry that includes an inorganic filler and a thermosetting resin is formed into a sheet-shaped thermal conductive mixture 71. Then, the thermal conductive mixture 71 is dried and sandwiched between metal foils 72, as shown in FIG. 7A. Next, the thermal conductive mixture 71 is cured by applying heat and pressure to form an insulating layer 73, as shown in FIG. 7B. Then, holes 74 are processed as shown in FIG. 7C, and connections are made between the layers by copper plating. Finally, as shown in FIG. 7D, a circuit pattern 75 is formed, resulting in a thermal conductive circuit board.

When a circuit board is produced in this manner, drilling is employed generally to form the holes. However, when the thermal conductive mixture includes a high proportion of inorganic filler to enhance thermal conductivity, a drill is worn significantly due to the hard inorganic filler in the insulating material. Moreover, chipping or the like occurs easily, and thus the hole quality often is degraded. If the drill is replaced at frequent intervals to prevent wear, the productivity is reduced greatly and the cost for processing holes is increased as compared with the general printed circuit board.

When holes are formed in the thermal conductive mixture with its thermosetting resin uncured, and then the thermal conductive resin mixture and the metal foils are bonded while applying heat and pressure for curing, the hole shape cannot be maintained because the thermal conductive mixture is softened by heating. This makes it difficult to form the holes, so that the subsequent plating is impossible.

SUMMARY OF THE INVENTION

Therefore, with the foregoing in mind, it is an object of the present invention to provide a method for manufacturing a circuit board with high thermal dissipation that can achieve improved productivity and low cost in processing holes.

A method for manufacturing a circuit board of the present invention includes the following: a first step of preparing a thermal conductive resin composition including 70 to 95 mass % of an inorganic filler and 5 to 30 mass % of a resin composition that includes a thermosetting resin in the uncured state, a thermoplastic resin, and a latent curing agent; a second step of preparing a circuit board precursor by heating the thermal conductive resin composition at a temperature lower than a temperature at which the thermosetting resin in the thermal conductive resin composition starts to cure while applying pressure so that the thermal conductive resin composition is solidified irreversibly; a third step of providing holes through the circuit board precursor; and a fourth step of curing the thermosetting resin in the circuit board precursor.

It is understood that mass % is equivalent to weight %.

In the method of the present invention, the second step may prepare the circuit board precursor by bringing the thermal conductive resin composition into contact with a metal foil and bonding the thermal conductive resin composition and the metal foil together by heating at a temperature lower than the temperature at which the thermosetting resin in the thermal conductive resin composition starts to cure while applying pressure so that the thermal conductive resin composition is solidified irreversibly. The method further may include a step of forming a circuit pattern by processing the metal foil.

In the method of the present invention, the second step may prepare the circuit board precursor by sandwiching the thermal conductive resin composition between two metal foils and bonding the thermal conductive resin composition and the metal foils together by heating at a temperature lower than the temperature at which the thermosetting resin in the thermal conductive resin composition starts to cure while applying pressure so that the thermal conductive resin composition is solidified irreversibly. The method further may include steps of providing through holes by plating the holes with copper to make an electrical connection between the metal foils and forming a circuit pattern by processing the metal foils.

According to these methods, the thermal conductive resin composition can be solidified with its thermosetting resin uncured and bonded to the metal foil. Therefore, the circuit board can be processed into a desired plate shape. Moreover, the holes can be formed in a simple manner because processing after the solidification is easy. Even if the thermosetting resin is cured after forming the holes, it is not necessary to apply pressure, unlike a conventional printed circuit board. Thus, the holes are not deformed or filled, and a change in the size caused by curing and shrinkage can be reduced.

In the method of the present invention, it is preferable that a step of making the thermal conductive resin composition integral with a reinforcing material is performed after the first step. This improves the strength of the circuit board. Moreover, when the thermal conductive resin composition is bonded to the metal foil, the thickness of the insulating layer can be maintained because of the reinforcing material, thereby preventing excessive effusion of the thermal conductive resin composition.

In the method of the present invention, it is preferable that the reinforcing material is made of at least one selected from a ceramic fiber and a glass fiber. These materials have high strength and relatively excellent thermal conductivity.

In the method of the present invention, it is preferable that the application of heat and pressure in the second step is performed under vacuum. This can reduce voids in the circuit board and prevent degradation of the metal foil.

In the method of the present invention, it is preferable that the curing in the fourth step is performed by applying heat and pressure. This can improve adhesion between the metal foil and the insulating substrate.

In the method of the present invention, it is preferable that the thermal conductive resin composition has a viscosity of 100 to 100000 Pa·s, and the thermal conductive resin composition in its irreversible solid state has a viscosity of $8 \times 10^4$ to $3 \times 10^6$ Pa·s. These viscosity ranges make it easier to process the thermal conductive resin composition into a substrate and to form the holes in the thermal conductive resin composition when it is solidified.

In the method of the present invention, it is preferable that the holes in the third step are processed with one selected from the group consisting of a punching machine, a punching die and a drill.

In the method of the present invention, it is preferable that at least a portion of the exterior of the circuit board precursor is processed to be a desired shape while processing the holes in the third step.

In the method of the present invention, it is preferable that the metal foil is a copper foil having a thickness of 12 to 200 μm, and at least one surface of the copper foil is made uneven.

In the method of the present invention, it is preferable that the temperature at which the thermal conductive resin composition is solidified irreversibly is 70 to 140° C.

In the method of the present invention, it is preferable that the inorganic filler includes at least one selected from the group consisting of $Al_2O_3$, $SiO_2$, MgO, BeO, $Si_3N_4$, SiC, AlN and BN.

A circuit board of the present invention includes an insulating substrate obtained by curing a thermal conductive resin composition, the thermal conductive resin composition including (a) 70 to 95 mass % of an inorganic filler and (b) 5 to 30 mass % of a resin composition that includes a thermosetting resin in the uncured state, a thermoplastic resin, and a latent curing agent. A circuit pattern is formed on at least one surface of the insulating substrate, and holes are formed to penetrate both surfaces of the insulating substrate.

In the circuit board of the present invention, it is preferable that the insulating substrate is obtained by curing the thermal conductive resin composition that is integral with a reinforcing material including at least one selected from a ceramic fiber and a glass fiber.

A power conversion module of the present invention includes a circuit board manufactured by the method according to the present invention, a semiconductor, and a passive component. The semiconductor and the passive component are mounted on the circuit board. Here, the power conversion module is referred to as a module that converts voltage and electric power by itself or by being connected to an auxiliary circuit. Examples of the power conversion module include a DC-CD converter and an inverter.

DESCRIPTION OF THE PREFERRED EMBODIMENTS

Figure 1:
FIG. 1 is a cross-sectional view showing a circuit board of Embodiment 1 of the present invention.

A method for manufacturing a circuit board according to embodiments of the present invention uses a thermal conductive resin composition as the main component. The thermal conductive resin composition includes an inorganic filler and a resin composition that includes a thermosetting resin in the uncured state, a thermoplastic resin, and a latent curing agent. Since the thermal conductive resin composition has a high degree of freedom of shape, it can be processed easily in the form of a sheet or layer. The thermal conductive resin composition also can be applied to or impregnated into a reinforcing material easily. Moreover, it can be bonded to a wiring pattern such as a lead frame, and a radiating fin by applying heat and pressure because the resin contained in the thermal conductive resin composition is uncured. Therefore, an excellent insulating property, airtightness, and adhesive property can be achieved. The thermal conductive resin composition can include a high proportion of inorganic filler, thereby increasing the thermal conductivity and reducing the thermal expansion coefficient of the circuit board. Moreover, the thermoplastic resin absorbs the uncured thermosetting resin at a temperature lower than the temperature at which the thermosetting resin starts to cure, so that the viscosity is increased to allow the thermal conductive resin composition to be solidified. Thus, holes can be processed while maintaining the shape, which leads to high productivity and high accuracy in processing the holes. By using the thermal conductive resin composition, a high insulating property can be achieved together with thermal conductivity and reliability, and a circuit board having excellent thermal dissipation can be produced in a simple manner.

A method for manufacturing a circuit board according to Embodiment 1 of the present invention includes the following steps in the order stated: preparing a circuit board precursor by bringing the thermal conductive resin composition into contact with a metal foil and bonding the thermal conductive resin composition and the metal foil together by heating at a temperature lower than the temperature at which the thermosetting resin in the thermal conductive resin composition starts to cure while applying pressure so that the thermal conductive resin composition is solidified irreversibly; providing holes through the circuit board precursor; curing the thermosetting resin in the circuit board precursor; and forming a circuit pattern by processing the metal foil.

A method for manufacturing a circuit board according to Embodiment 2 of the present invention includes the following steps in the order stated: preparing a circuit board precursor by sandwiching the thermal conductive resin composition between two metal foils and bonding the thermal conductive resin composition and the metal foils together by heating at a temperature lower than the temperature at which the thermosetting resin in the thermal conductive resin composition starts to cure while applying pressure so that the thermal conductive resin composition is solidified irreversibly; providing holes through the circuit board precursor; curing the thermosetting resin in the circuit board precursor; providing through holes by plating the holes with copper to make an electrical connection between the metal foils; and forming a circuit pattern by processing the metal foils.

A method for manufacturing a circuit board according to Embodiment 3 of the present invention includes the following steps in the order stated: applying/impregnating the thermal conductive resin composition to/into a reinforcing material; preparing a circuit board precursor by sandwiching the thermal conductive resin composition between two metal foils and bonding the thermal conductive resin composition and the metal foils together by heating at a temperature lower than the temperature at which the thermosetting resin in the thermal conductive resin composition starts to cure while applying pressure so that the thermal conductive resin composition is solidified irreversibly; providing holes through the circuit board precursor; curing the thermosetting resin in the circuit board precursor; providing through holes by plating the holes with copper to make an electrical connection between the metal foils; and forming a circuit pattern by processing the metal foils.

A method for manufacturing a power conversion module according to Embodiment 4 of the present invention includes forming an electric circuit by mounting at least a semiconductor and a passive component on a circuit board produced by the method of each of the embodiments so as to provide the power conversion function.

Hereinafter, methods for manufacturing a circuit board and a power conversion module including the circuit board of the present invention will be described with reference to the drawings.

Embodiment 1

FIG. 1 shows a circuit board according to an embodiment of the present invention. In FIG. 1, reference numeral 11 denotes an insulating substrate obtained by curing the thermal conductive resin composition, 12 denotes a circuit pattern, and 13 denotes holes. The holes 13 may be formed through the circuit board.

Figure 2A:
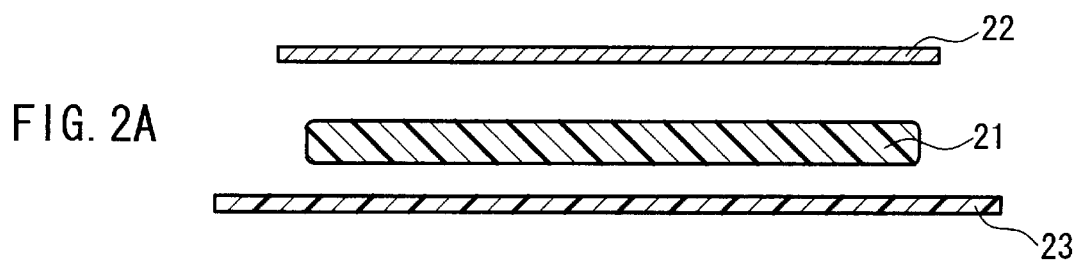
FIGS. 2A to 2E are cross-sectional views showing steps in a method for manufacturing a circuit board of Embodiment 1 of the present invention.
Figure 2B:
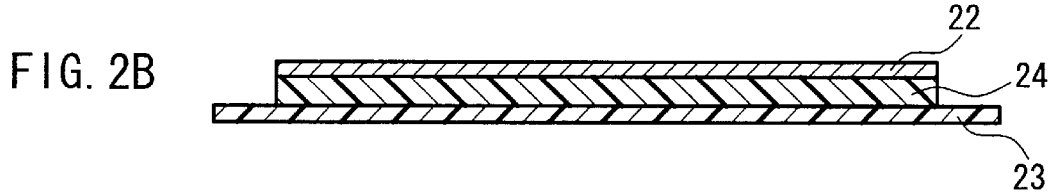
Figure 2C:
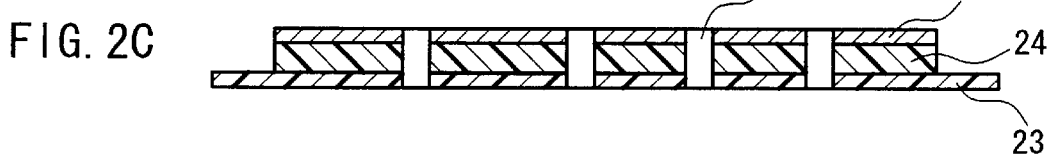
Figure 2D:
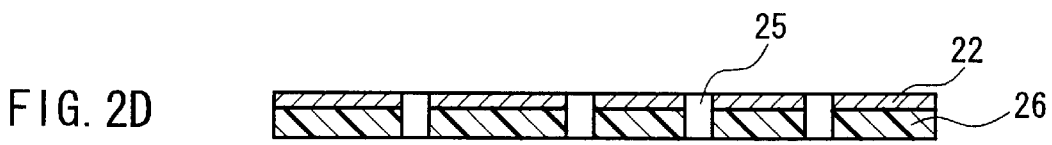
Figure 2E:

FIGS. 2A to 2E are cross-sectional views illustrating steps in a method for manufacturing a circuit board of Embodiment 1 of the present invention. As shown in FIG. 2A, a thermal conductive resin composition 21 and a metal foil 22 are superimposed. Reference numeral 23 is a release film for preventing adhesion of the thermal conductive resin composition 21. The thermal conductive resin composition 21 and the metal foil 22 are bonded together by heating at a temperature lower than the temperature at which the thermosetting resin in the thermal conductive resin composition 21 starts to cure while applying pressure, and thus formed into a substrate. At the same time, the thermal conductive resin composition 21 is solidified irreversibly, so that a circuit board precursor 24 is obtained, as shown in FIG. 2B. Then, holes 25 are provided by punching, as shown in FIG. 2C. The thermal conductive resin composition 21 is cured by heating to form an insulating substrate 26, followed by removing the release film 23, as shown in FIG. 2D. Finally, as shown in FIG. 2E, the metal foil 22 is processed to form a circuit pattern 27, resulting in a circuit board.

The thermal conductive resin composition 21 includes an inorganic filler and a resin composition that includes an uncured liquid thermosetting resin, thermoplastic resin powder, and a latent curing agent. The inorganic filler can be selected appropriately from materials with excellent thermal conductivity and insulating properties. In particular, it is preferable that the inorganic filler includes at least one selected from the group consisting of $Al_2O_3$, $SiO_2$, MgO, BeO, $Si_3N_4$, SiC, AlN and BN in powder form as the main component. Since these powdered materials are excellent in thermal conductivity, a circuit board with high thermal dissipation can be produced. The use of $Al_2O_3$ and $SiO_2$ particularly makes mixing with the resin composition easier. The use of AlN particularly increases the thermal dissipation of the insulating substrate 26. The particle diameter of the inorganic filler is preferably in the range of 0.1 to 100 μm. When the particle diameter falls outside this range, the filling property of the filler and the thermal dissipation of the substrate are reduced.

The ratio of the inorganic filler contained in the thermal conductive resin composition 21 and the insulating substrate 26, which is obtained by curing the thermal conductive resin composition 21, should be 70 to 95 mass %, and preferably 85 to 95 mass %. When the ratio is below this range, the thermal dissipation of the substrate becomes poor. When the ratio is above this range, the flowability and adhesive property of the thermal conductive resin composition 21 are reduced, making it difficult to adhere to the metal foil 22 and the circuit pattern 27.

The thermal conductive resin composition 21 includes at least a liquid thermosetting resin. Epoxy resin is preferred for the thermosetting resin because of its excellent heat resistance, mechanical strength, and insulating property. Since the epoxy resin is in the liquid state, the viscosity of the thermal conductive resin composition is decreased. Therefore, the processability of the thermal conductive resin composition can be improved even without a solvent, which facilitates processing of the insulating substrate. Moreover, the epoxy resin includes no solvent, so that voids generated in the insulating substrate can be reduced to improve the insulating property of the insulating substrate. There is no particular limitation to the liquid epoxy resin, as long as it is in the liquid state at room temperature. For example, bisphenol A epoxy resin, bisphenol F epoxy resin, bisphenol AD epoxy resin, and phenol novolac epoxy resin can be used. Alternatively, epoxy resin in the solid state at room temperature may be added. In such a case, the same epoxy resins as those described above can be used. Also, partially brominated epoxy resin may be added, which improves the flame resistance of the thermal conductive resin composition and the insulating substrate.

The thermal conductive resin composition 21 includes at least thermoplastic resin. This thermoplastic resin swells by absorbing the liquid thermosetting resin in the thermal conductive resin composition The type of the thermoplastic resin is not particularly limited, and thermoplastic resin in the form of powder that exhibits the above function is preferable. For example, powder of one or more of polyvinyl chloride, polymethyl methacrylate, polyethylene, polystyrene, and polyvinyl acetate can be used. The particle diameter of the thermoplastic resin powder is preferably in the range of 1 to 100 μm because the inorganic filler and the liquid epoxy resin are mixed easily.

The thermal conductive resin composition 21 includes at least a latent curing agent. The latent curing agent is not particularly limited, as long as it can be used for the thermosetting resin. For example, an amine adduct curing agent and a dicyandiamide curing agent can be used.

It is preferable that the resin composition, including the liquid thermosetting resin, the thermoplastic resin powder and the latent curing agent, further includes at least one selected from a coupling agent, a dispersant and a coloring agent. The coupling agent can improve the adhesion between the inorganic filler, the metal foil, and the resin composition. Examples of the coupling agent include an epoxysilane coupling agent, an aminosilane coupling agent, and a titanate coupling agent. The dispersant can improve the dispersibility of the thermal conductive resin composition to ensure uniform dispersion. Examples of the dispersant include phosphoric ester. The coloring agent can improve the thermal radiation of the thermal conductive resin composition by coloring. Examples of the coloring agent include carbon.

The thermal conductive resin composition 21 may be produced by weighing and mixing each of the materials. For example, a ball mill, a planetary mixer, or an agitator can be used for mixing. The thermal conductive resin composition 21 preferably is in the form of clay or paste and has a viscosity of 100 to 100000 Pa·s, more preferably 1000 to 80000 Pa·s. This viscosity range makes handling of the thermal conductive resin composition easier, so that it can be processed easily into the insulating substrate by the subsequent application of heat and pressure. Here, the viscosity range corresponds to temperatures lower than the heating temperature used in FIG. 2B. Therefore, the viscosity within the above range may correspond to a certain temperature between room temperature and the heating temperature.

It is preferable that the thermal conductive resin composition 21 is processed in the form of a sheet. This facilitates handling of the thermal conductive resin composition, so that it can be processed easily into the insulating substrate, as shown in FIG. 2B. Moreover, the amount of voids in the thermal conductive resin composition can be reduced. A method for processing the thermal conductive resin composition into a sheet is not particularly limited and can be selected appropriately in accordance with the viscosity and properties of the thermal conductive resin composition. For example, extrusion with an extruder, coating with a roll coater or a curtain coater, printing, and a doctor blade can be used.

There is no particular limitation to the metal foil 22, as long as a material can have excellent conductivity and form a circuit pattern. For example, copper, nickel, aluminum, and an alloy that includes any one of these metals as the main component can be used. In particular, copper and an alloy including copper as the main component are preferred because copper is excellent in conductivity, inexpensive, and can form a circuit pattern easily. It is preferable that one surface of the metal foil 22 in contact with the thermal conductive resin composition is made uneven. This can improve the adhesive strength between the metal foil 22 and the thermal conductive resin composition 21. The thickness of the metal foil is preferably in the range of 12 to 200 μm, and more preferably in the range of 35 to 100 μm. When the thickness is well below the preferred range, the allowable current per unit width is reduced. Thus, the circuit area has to be increased to carry a large current, which is disadvantageous in achieving miniaturization. When the thickness is well above the preferred range, it is difficult to form a high-accuracy circuit pattern.

Though the release film 23 is not essential to the manufacture of a circuit board of the present invention, it serves to provide easy release. For example, a polyethylene terephthalate (PET) film or a polyphenylene sulfide (PPS) film can be used. It is preferable to use these films by applying a release agent such as silica to their surfaces.

In the step for preparing the circuit board precursor 24 shown in FIG. 2B, the thermal conductive resin composition 21 and the metal foil 22 are bonded together by applying heat and pressure, and thus formed into a substrate. At the same time, the thermoplastic resin powder in the thermal conductive resin composition 21 swells by absorbing the liquid epoxy resin to cause an increase in viscosity, so that the thermal conductive resin composition 21 is solidified irreversibly. In this case, the heating temperature should be lower than the temperature at which the thermosetting epoxy resin starts to cure, and preferably higher than the glass transition temperature or softening point of the thermoplastic resin powder and lower than the melting point thereof. Specifically, the heating temperature is preferably in the range of 70 to 140° C., and more preferably in the range of 80 to 130° C. The pressure to be applied is not particularly limited, as long as the metal foil and the thermal conductive resin composition can be bonded together and formed into a substrate. The pressure is generally in the range of 2 to 20 MPa, and preferably in the range of 2 to 5 MPa. The application of heat and pressure can be performed, e.g., with a press having a heating plate. Moreover, it is preferable that the application of heat and pressure is performed under vacuum so as to prevent oxidation of the metal foil and remove voids in the thermal conductive resin composition. Here, vacuum indicates the state of reduced pressure lower than an atmospheric pressure.

The thermal conductive resin composition preferably has a viscosity of $8 \times 10^4$ to $3 \times 10^6$ Pa·s, and more preferably $1 \times 10^5$ to $1 \times 10^6$ Pa·s when solidified irreversibly by the application of heat and pressure as described above. This preferred range makes it possible to maintain the shape of the substrate even if it is handled in a conventional manner and to form the holes easily as shown in FIG. 2C. When the viscosity is below the range, it is difficult to process the holes while maintaining the substrate shape. When the viscosity is above the range, it is difficult to process the holes. To adjust the viscosity in the preferred range, the mixing ratio of the liquid epoxy resin and the thermoplastic resin powder in the thermal conductive resin composition 21 may be adjusted. The mixing ratio changes depending on the type of the thermoplastic resin powder, and generally about 10 to 100 parts of the thermoplastic resin powder is used with respect to 100 parts of the liquid epoxy resin.

A method for processing the holes 25 in FIG. 2C is not particularly limited and can be selected appropriately in accordance with the thickness of the insulating substrate 26 and a desired hole diameter. For example, a punching machine, a punching die, and a drill can be used. These means are convenient and can process the holes with high positioning accuracy. In particular, punching with a punching machine is preferred. The punching is industrially superior to drilling because there is not much contact between the processing tool and the substrate material, and wear of the processing tool is reduced to make a considerable improvement in the durability.

It is preferable that at least a portion of the exterior of the circuit board precursor is processed while processing the holes so that the circuit board is divided or a portion thereof is separated. This is because processing the exterior of the circuit board precursor at the same time as the holes is easier than processing it after the thermosetting resin has been cured. Moreover, the circuit board can be divided easily even when a plurality of circuit patterns are formed on a single substrate. It is preferable that a means for processing the exterior of the circuit board precursor also can process the holes. Therefore, like the preferred examples of processing of the holes, a method for processing the exterior of the circuit board precursor includes cutting with a punching machine, cutting with a punching die, and drilling.

The thermosetting epoxy resin is cured by heating to form the insulating substrate 26 shown in FIG. 2D. The heating temperature can be selected appropriately in accordance with the reaction of the epoxy resin and the latent curing agent. It is preferably in the range of 140 to 240° C., and more preferably in the range of 150 to 200° C. When the heating temperature is below the preferred range, curing may be insufficient and take a long time. When the heating temperature is above the preferred range, thermal decomposition of the resin may occur. Moreover, it is preferable to apply pressure during the heating. This can suppress warping of the substrate while it is heated for curing, thereby producing a very flat substrate and improving the adhesion between the metal foil and the insulating substrate. The pressure to be applied can be selected appropriately. It is generally not more than 3 MPa, and preferably in the range of 0.001 to 1 MPa. When the pressure is above this range, the holes may be deformed. Moreover, it is preferable that the heating is performed under vacuum or a non-oxidizing atmosphere so as to prevent oxidation of the metal foil. In FIG. 2D, the release film 23 is removed at this point in time. However, the release film may be removed when it becomes unnecessary. For example, the release film can be removed while processing the holes in FIG. 2C.

There is no particular limitation to a method for forming the circuit pattern 27 in FIG. 2E, and a conventionally known method, such as chemical etching, can be used.

Embodiment 2

Figure 3:
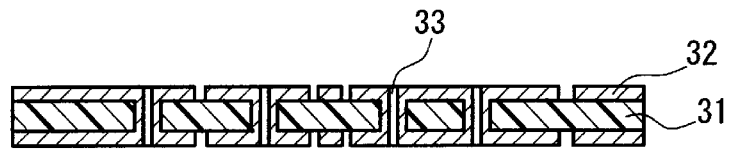
FIG. 3 is a cross-sectional view showing a circuit board of Embodiment 2 of the present invention.

FIG. 3 shows a circuit board according to another embodiment of the present invention. In FIG. 3, reference numeral 31 denotes an insulating substrate obtained by curing the thermal conductive resin composition, 32 denotes a circuit pattern, and 33 denotes through holes formed by plating holes in the insulating substrate 31 with copper to make an electrical connection between the circuit patterns on both surfaces.

Figure 4A:
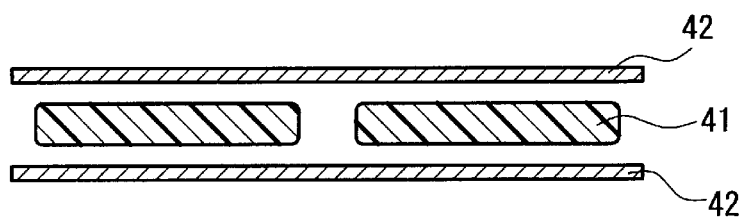
FIGS. 4A to 4F are cross-sectional views showing steps in a method for manufacturing a circuit board of Embodiment 2 of the present invention.
Figure 4B:
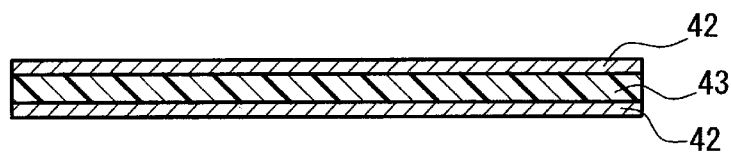
Figure 4C:
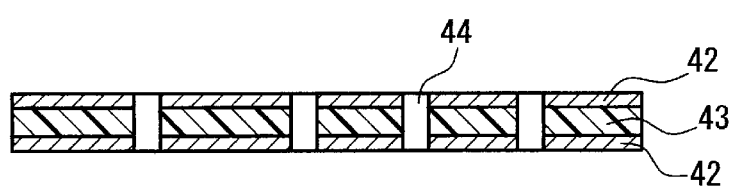
Figure 4D:
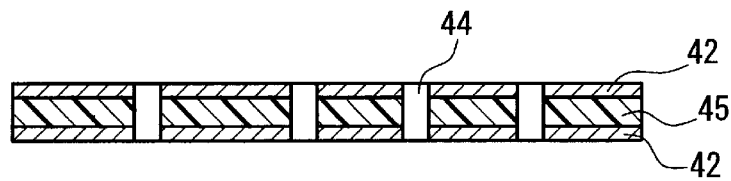
Figure 4E:
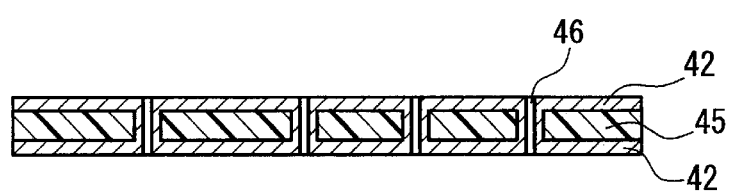
Figure 4F:
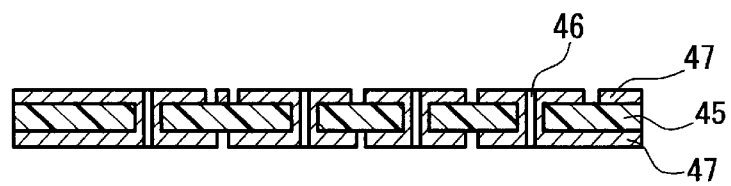

FIGS. 4A to 4F are cross-sectional views illustrating steps in a method for manufacturing a circuit board of Embodiment 2. As shown in FIG. 4A, a plurality of thermal conductive resin compositions 41 are sandwiched between metal foils 42. The thermal conductive resin compositions 41 and the metal foils 42 are bonded together by heating at a temperature lower than the temperature at which the thermosetting resin in the thermal conductive resin compositions 41 starts to cure while applying pressure, and thus the thermal conductive resin compositions 41 coalesce into one to form a substrate. At the same time, the coalescent thermal conductive resin composition 41 is solidified irreversibly, so that a circuit board precursor 43 is obtained, as shown in FIG. 4B. Then, holes 44 are provided in the circuit board precursor 43 by punching, as shown in FIG. 4C. The thermal conductive resin composition 41 is cured by heating while maintaining the shape of the holes 44 to form an insulating substrate 45, as shown in FIG. 4D. Thereafter, through holes 46 are provided by plating to make an electrical connection between the metal foils 42 on both surfaces, as shown in FIG. 4E. Finally, as shown in FIG. 4F, each of the metal foils 42 is processed to form a circuit pattern 47, resulting in a circuit board.

The thermal conductive resin compositions 41 and the metal foils 42 used in Embodiment 2 may be the same as those in Embodiment 1. The circuit board precursor 43, the holes 44, the insulating substrate 45, and the circuit pattern 47 can be produced in the same manner as that described in Embodiment 1.

It is preferable that the through holes 46 in FIG. 4E are formed by plating the entire surface of the holes 44 with copper because copper has a small resistance and large allowable current. In this case, the metal foils 42 preferably are made of copper as well. The thermal expansion coefficient of the metal foils matches that of the plating, which leads to an improvement in reliability.

Embodiment 3

Figure 5A:
FIGS. 5A to 5F are cross-sectional views showing steps in a method for manufacturing a circuit board of Embodiment 3 of the present invention.
Figure 5B:
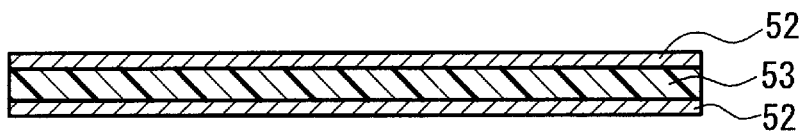
Figure 5C:
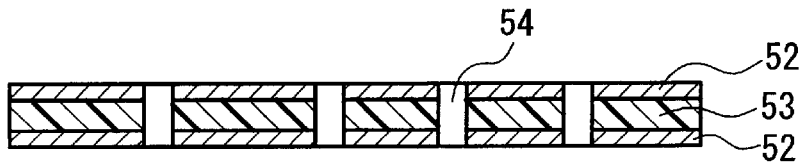
Figure 5D:
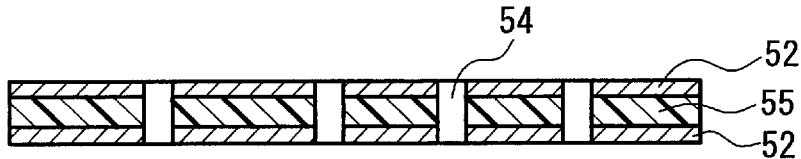
Figure 5E:
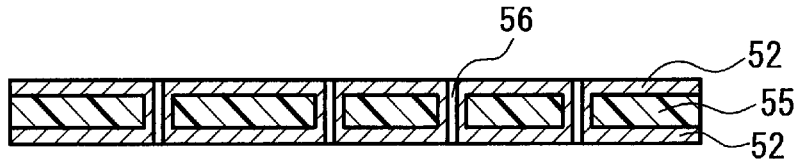
Figure 5F:
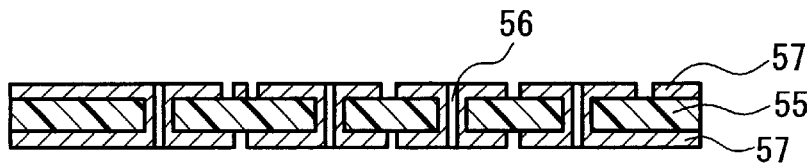

FIGS. 5A to 5F are cross-sectional views illustrating steps in a method for manufacturing a circuit board according to another embodiment of the present invention. In FIG. 5A, reference numeral 51 denotes a sheet-shaped thermal conductive resin composition in which the thermal conductive resin composition is applied to or impregnated into a reinforcing material. As shown in FIG. 5B, the sheet-shaped thermal conductive resin composition 51 is sandwiched between metal foils 52. The sheet-shaped thermal conductive resin composition 51 and the metal foils 52 are bonded together by heating at a temperature lower than the temperature at which the thermosetting resin in the sheet-shaped thermal conductive resin composition 51 starts to cure while applying pressure, and thus formed into a substrate. At the same time, the sheet-shaped thermal conductive resin composition 51 is solidified irreversibly, so that a circuit board precursor 53 is obtained, as shown in FIG. 5B. Then, holes 54 are provided in the circuit board precursor 53 by punching, as shown in FIG. 5C. The sheet-shaped thermal conductive resin composition 51 is cured by heating while maintaining the shape of the holes 54 to form an insulating substrate 55, as shown in FIG. 5D. Thereafter, through holes 56 are provided by plating to make an electrical connection between the metal foils 52 on both surfaces, as shown in FIG. 5E. Finally, as shown in FIG. 5F, each of the metal foils 52 is processed to form a circuit pattern 57, resulting in a circuit board.

The thermal conductive resin composition in the sheet-shaped thermal conductive resin composition 51 and the metal foils 52 used in Embodiment 3 may be the same as those in Embodiment 1. The circuit board precursor 53, the holes 54, the insulating substrate 55, and the circuit pattern 57 can be produced in the same manner as that described in Embodiment 1. The same method as that in Embodiment 2 can be used to form the through holes 56.

Examples of the reinforcing material used in this embodiment include a ceramic fiber, a glass fiber, and a fabric made of resin fiber. In particular, the ceramic fiber or the glass fiber is preferred. The ceramic and glass are excellent in heat resistance and thus have high reliability. Moreover, their thermal conductivity is high compared with resin, so that the thermal conductivity of the substrate can be improved.

Examples of the ceramic include alumina, silica, and silicon nitride. When the above fiber is used, it is preferable that the reinforcing material is a nonwoven fabric. Compared with woven fabric, the reinforcing material of nonwoven fabric is porous and less dense. Therefore, it can absorb the inorganic filler easily without causing a change in composition ratio of the thermal conductive resin composition that is applied to or impregnated into the reinforcing material. Moreover, it is preferable that the fiber has a diameter of not more than 10 μm. When the diameter is much greater than this value, the compression property for forming the substrate is reduced and the thermal conduction in the inorganic filler tends to be prevented. Consequently, the thermal resistance of the substrate may become higher.

A method for producing the sheet-shaped thermal conductive resin composition 51 by integrally forming the reinforcing material and the thermal conductive resin composition is not particularly limited. For example, the thermal conductive resin composition can be applied to or impregnated into the reinforcing material. Alternatively, the thermal conductive resin composition that has been processed into a sheet can be bonded to the reinforcing material.

In Embodiment 3, the sheet-shaped thermal conductive resin composition 51 is used to produce a circuit board in which the wirings on both surfaces are connected by the through holes. However, it is possible to produce a single sided circuit board by using the same method as Embodiment 1. The single sided circuit board includes an insulating substrate formed of the thermal conductive resin composition that is integral with the reinforcing material.

Embodiment 4

Figure 6:
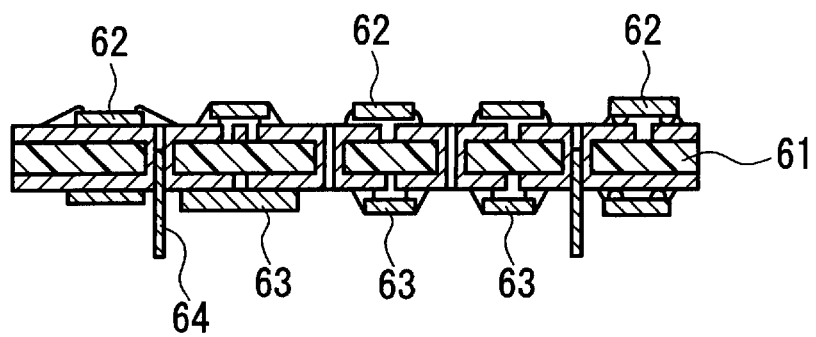
FIG. 6 is a cross-sectional view showing a power conversion module of Embodiment 4 of the present invention.
Figure 7A:
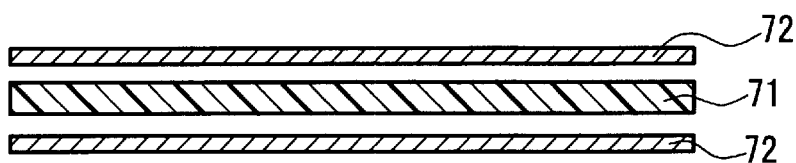
FIGS. 7A to 7D are cross-sectional views showing steps in a method for manufacturing a conventional circuit board.
Figure 7B:
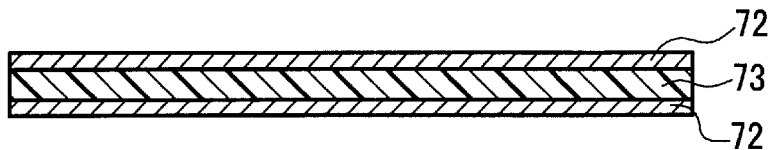
Figure 7C:
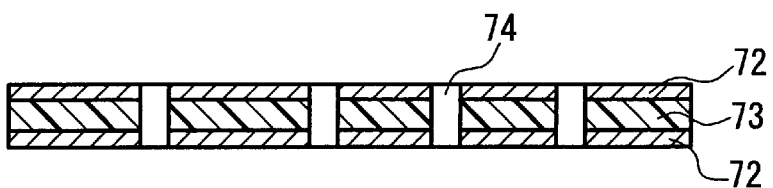
Figure 7D:
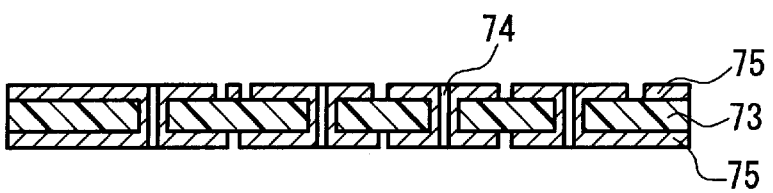

FIG. 6 is a cross-sectional view illustrating a power conversion module according to another embodiment of the present invention. In FIG. 6, reference numeral 61 is a circuit board manufactured by the method described in any of the embodiments, on which semiconductor devices 62 and passive components 63 are mounted to form a power conversion circuit. Moreover, mechanism components 64, such as an external electrode or the like, are connected to the power conversion circuit board.

Each component can be mounted by a conventionally known technique, e.g., reflow soldering, flow soldering, wire bonding, and flip chip bonding. For soldering, a solder resist film may be formed on the circuit board 61 to prevent unnecessary effusion of solder. It is preferable that the surface of a circuit pattern is protected by a metal coating against the oxidation and corrosion of the metal foil that acts as the circuit pattern. As the metal coating, e.g., solder and tin can be used.

Next, a method for manufacturing a circuit board and a mounted device including the circuit board will be described in detail by way of specific examples.

EXAMPLE 1

An inorganic filler and a resin composition were mixed to produce a thermal conductive resin composition. The materials and mixing ratio used follow.

(1) Inorganic filler: 87 mass % of $Al_2O_3$ ("AS-40" manufactured by Showa Denko K.K, an average particle diameter of 12 μm)
(2) Liquid thermosetting resin: 7 mass % of bisphenol A epoxy resin ("Epicoat 828" manufactured by Yuka Shell Epoxy Co., Ltd.)
(3) Thermoplastic resin powder: 3.5 mass % of polymethyl methacrylate (manufactured by Kanto Kagaku)
(4) Latent curing agent: 1.5 mass % of amine-based curing agent ("Amicure PN-23" manufactured by Ajinomoto Co., Inc.)
(5) Other additives: 0.5 mass % of carbon black (manufactured by Toyo Carbon Co., Ltd.) and 0.5 mass % of coupling agent ("Plenact KR-46B" manufactured by Ajinomoto Co., Inc.)

Figure 8:
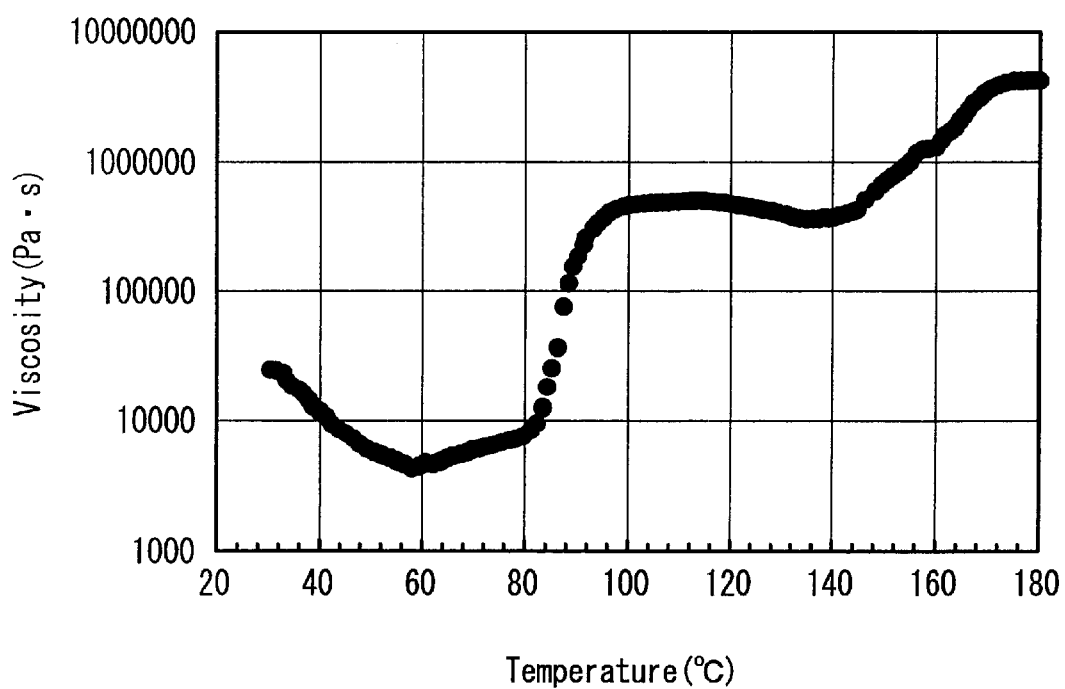
FIG. 8 is a graph showing the viscosity of a thermal conductive resin composition of Embodiment 1 of the present invention.

These materials were weighed and mixed with a planetary mixer to produce a thermal conductive resin composition. The thermal conductive resin composition was processed into a sheet having a thickness of about 0.8 mm with a roll coater. The viscosity of this thermal conductive resin composition was measured while increasing the temperature with an active viscoelastic analyzer (manufactured by UBM corporation). FIG. 8 shows the resultant viscosity characteristics. As can be seen from FIG. 8, when the temperature is more than about 80° C., the thermal conductive resin composition starts to solidify irreversibly. When the temperature reaches about 100° C., the irreversible solidification is completed. While the temperature is raised continuously, the viscosity is kept substantially constant until about 140° C. The thermal conductive resin composition starts to cure with a further increase in temperature and completely cures at a temperature of about 170° C. or more.

The sheet-shaped thermal conductive resin composition was deposited on a PPS release film having a thickness of 70 μm, on which a copper foil (manufactured by Furukawa Electric Co., Ltd.) having a thickness of 35 μm and one uneven surface was deposited so that the uneven surface was in contact with the thermal conductive resin composition, as shown in FIG. 2A. The thermal conductive resin composition and the copper foil were bonded together with a hot press by applying heat and pressure simultaneously at a temperature of 100° C. and a pressure of 3 MPa for 10 minutes under a reduced pressure atmosphere, and thus formed into a substrate as shown in FIG. 2B. At the same time, the thermal conductive resin composition was solidified irreversibly, so that a circuit board precursor having a thickness of about 0.8 mm was obtained. Then, holes having a diameter of 0.6 mm were provided in the circuit board precursor by drilling, as shown in FIG. 2C. The circuit board precursor was heated in a nitrogen atmosphere at 170° C. for one hour so as to cure the epoxy resin in the thermal conductive resin composition, and the release film was removed. Thus, an insulating substrate with the copper foil was prepared, as shown in FIG. 2D. A photo-curing dry film resist (manufactured by Nichigo-Morton Co., Ltd.) was laminated on the metal foil, which then was exposed, developed, and etched in a ferric chloride solution to form a circuit pattern. Finally, as shown in FIG. 2E, the dry film resist coating was removed, resulting in a single sided circuit board.

For a comparative example 1, the same sheet-shaped thermal conductive resin composition, copper foil, and release film as those in Example 1 were superimposed as shown in FIG. 2A, which then was heated and pressed with a hot press at a temperature of 170° C. and a pressure of 3 MPa for 1.5 hours under reduced pressure so as to cure the epoxy resin in the thermal conductive resin composition. Thus, a single sided copper-clad substrate was prepared. Thereafter, holes having a diameter of 0.6 mm were provided by drilling, resulting in a circuit board.

The durability of a drill made of super-hard alloy (manufactured by Union Tool Co.) used for forming the holes in Example 1 was compared with that in the comparative example 1. In Example 1, the drill was not much worn even after drilling was performed 1000 times. Therefore, the subsequent punching was carried out, and the circuit board was free from chipping and burrs on the wall of the holes. In the comparative example 1, however, the drill was worn significantly. Therefore, burrs were caused in the copper foil when drilling was performed only 100 times, making the subsequent punching impossible. This proved that a method for manufacturing a circuit board of Example 1 is excellent in processing holes.

EXAMPLE 2

An inorganic filler and a resin composition were mixed to produce a thermal conductive resin composition. The materials and mixing ratio used follow.

(1) Inorganic filler: 88 mass % of $Al_2O_3$ ("AS-40" manufactured by Showa Denko K.K., an average particle diameter of 12 μm)

(2) Liquid thermosetting resin: 5 mass % of bisphenol F epoxy resin ("Epicoat 807" manufactured by Yuka Shell Epoxy Co., Ltd.)

(3) 2 mass % of brominated epoxy resin ("Epicoat 5050" manufactured by Yuka Shell Epoxy Co., Ltd)

(4) Thermoplastic resin powder: 3 mass % of polymethyl methacrylate (manufactured by Kanto Kagaku)

(5) Latent curing agent: 1 mass % of amine-based curing agent ("Amicure PN-23" manufactured by Ajinomoto Co., Inc.) and 0.4 mass % of dicyandiamide (manufactured by Dainippon Ink and Chemicals, Inc.)

(6) Other additives: 0.4 mass % of carbon black (manufactured by Toyo Carbon Co., Ltd.) and 0.2 mass % of coupling agent ("Plenact KR-46B" manufactured by Ajinomoto Co., Inc.)

These materials were weighed and mixed with a stirring/kneading machine to produce a thermal conductive resin composition. The thermal conductive resin composition was processed into a sheet having a thickness of about 1.0 mm with an extruder. The viscosity of this thermal conductive resin composition was about 9000 Pa·s at 50° C. and about 800000 Pa·s at 110° C.

The sheet-shaped thermal conductive resin composition was sandwiched between copper foils (manufactured by Circuit Foil Japan Co., Ltd), each having a thickness of 70 μm and one uneven surface, so that the uneven surfaces were in contact with the thermal conductive resin composition, as shown in FIG. 4A. Note that the thermal conductive resin composition in Example 2 was in the form of a sheet and did not correspond to the drawing. The thermal conductive resin composition and the copper foils were bonded together with a hot press by applying heat and pressure simultaneously at a temperature of 90° C. and a pressure of 3 MPa for 15 minutes under a reduced pressure atmosphere, and thus formed into a substrate as shown in FIG. 4B. At the same time, the thermal conductive resin composition was solidified irreversibly, so that a circuit board precursor having a thickness of about 1.0 mm was obtained. Then, holes having a diameter of 0.5 mm were provided in the circuit board precursor with a punching machine (manufactured by UHT Corp.), as shown in FIG. 4C. The circuit board precursor was heated at 170° C. for 2 hours while applying a pressure of 0.01 MPa so as to cure the epoxy resin in the thermal conductive resin composition. Thus, an insulating substrate with the copper foils was prepared, as shown in FIG. 4D. Thereafter, copper-plated through holes were provided by plating the entire surface with copper to a thickness of about 30 μm, as shown in FIG. 4E. Finally, as shown in FIG. 4F, a circuit pattern was formed in the same manner as Example 1, resulting in a double sided circuit board.

For comparison, the same sheet-shaped thermal conductive resin composition, copper foils, and release film as those in Example 2 were superimposed as shown in FIG. 4A, which then was heated and pressed with a hot press at a temperature of 170° C. and a pressure of 3 MPa for 1.5 hours under reduced pressure so as to cure the epoxy resin in the thermal conductive resin composition. Thus, a double sided copper-clad substrate having a thickness of about 1.0 mm was prepared. Thereafter, the same punching machine as described above was used to form holes having a diameter of 0.5 mm. However, the pins of the punching machine did not penetrate the substrate, and it was impossible to provide the holes. This proved that a method for manufacturing a circuit board of Example 2 is excellent in processing holes.

For a comparative example 2, a glass-epoxy double sided printed circuit board (ANSI grade FR-4) was produced that included an insulating layer, a wiring layer, and copper-plated through holes. The insulating layer and the wiring layer had about the same thickness.

A through hole chain pattern (500-holes connection) was formed in each circuit board of Example 2 and the comparative example 2. Then, a hot oil test was carried out to measure a resistance of the circuit board. In the test, the circuit board was dipped into oil at 20° C. for 10 seconds and then at 260° C. for 10 seconds per cycle, and this cycle was repeated. As a result, the resistance of the circuit board in the comparative example 2 increased after 350 cycles to cause disconnection. However, the resistance of the circuit board in Example 2 did not increase even after 3000 cycles, so that favorable connection was maintained. This proved that the circuit board in Example 2 is highly reliable.

EXAMPLE 3

The same materials as those in Example 1 were mixed to produce a thermal conductive resin composition. A glass nonwoven fabric (having a thickness of about 0.2 mm and a fiber diameter of 9 μm) was used as a reinforcing material. The thermal conductive resin composition was applied to both surfaces of the glass nonwoven fabric with a roll, and thus the thermal conductive resin composition provided with the reinforcing material having a thickness of about 0.8 mm was obtained, as shown in FIG. 5A.

The thermal conductive resin composition was sandwiched between copper foils (manufactured by Furukawa Electric Co., Ltd.), each having a thickness of 35 μm and one uneven surface, so that the uneven surfaces were in contact with the thermal conductive resin composition, as shown in FIG. 5B. The thermal conductive resin composition and the copper foils were bonded together with a hot press by applying heat and pressure simultaneously at a temperature of 100° C. and a pressure of 3 MPa for 10 minutes under reduced pressure, and thus formed into a substrate as shown in FIG. 5C. At the same time, the thermal conductive resin composition was solidified irreversibly, so that a circuit board precursor having a thickness of about 0.8 mm was obtained. Then, holes having a diameter of 0.8 mm as shown in FIG. 4C were provided in the circuit board precursor with a punching die. A slit having a width of 1 mm was provided between the portion of the circuit board precursor where a circuit was formed and the outer circumference of that portion, with some connections left. The circuit board precursor was heated in a nitrogen atmosphere at 170° C. for 2 hours so as to cure the epoxy resin in the thermal conductive resin composition. Thus, an insulating substrate with the copper foils was prepared, as shown in FIG. 5D. Thereafter, copper-plated through holes were provided by plating the entire surface with copper to a thickness of about 30 μm, as shown in FIG. 5E. Finally, as shown in FIG. 5F, a circuit pattern was formed in the same manner as Example 1, resulting in a double sided circuit board. It was possible to obtain circuit boards with desired external dimensions by cutting the connections.

The circuit boards in Example 1 and Example 3 were processed to have the same size, and the transverse strength of each circuit board was measured after removing the copy foil. The transverse strength of the circuit board in Example 1 was 210 MPa, while that of the circuit board in Example 3 was 280 MPa. This result proved that, though the circuit board in Example 1 has sufficient strength for practical use, the reinforcing material serves to improve the circuit board strength.

The thermal resistance of each circuit board in Example 1, 3, and the comparative example 2 was measured. The thermal resistance represents a temperature rise with respect to output power when heat-generating elements are mounted on the circuit board. The temperature rise decreases as the thermal resistance becomes smaller, which leads to an increase in operation tolerance of the components. By using a thermal resistance tester (manufactured by CATS Inc.), the measurement was carried out in the following manner. An FET (TO-220 package) was mounted on the same pattern of each circuit board. The opposite surface of the circuit board to the FET was connected to a heatsink with a fin. The heatsink was capable of keeping the temperature constant. Under these conditions, a predetermined electric power was applied to a semiconductor, and a change in temperature of the semiconductor was estimated from a change in voltage of a PN junction of the semiconductor. Then, the temperature difference was divided by the electric power. As a result, the thermal resistance of the circuit boards in Example 1, Example 3 and the comparative example 2 were 1.02° C./W, 1.11° C./W and 8.4° C./W, respectively. This proved that there is not a large difference in the thermal resistance of the circuit boards even if the reinforcing material is included, and the circuit boards of the present examples are thermally superior to the general printed circuit board in the comparative example 2 because of their very small thermal resistance.

EXAMPLE 4

Using a metal mask, solder paste (manufactured by Senju Metal Industry Co., Ltd.) was printed on each circuit board in Example 2 and the comparative example 2 by screen printing. Then, a semiconductor device (manufactured by Mitsubishi Electric Corporation), passive components (manufactured by Matsushita Electronic Components Co., Ltd.) including, e.g., a capacitor, a transformer, a choke and a resistor, and a mechanism component such as an external electrode were mounted on the respective circuit boards, which then were soldered in a reflow furnace (manufactured by Matsushita Electric Works, Ltd.). Thus, DC-CD converters were produced as a power conversion module.

A load of 30 W was applied to the DC-CD converters, and the temperature of a power semiconductor was measured 10 minutes after the application of load with a thermoviewer (manufactured by Nikon Corporation). The temperature was 48° C. for the circuit board in Example 2, while it was 63° C. for the circuit board in the comparative example 2. This result proved that the power conversion module including the circuit board in Example 2 is advantageous in operation and reliability because the temperature rise of the components is small.

As described above, a method for manufacturing a circuit board of the present invention can facilitate processing holes in an insulating substrate whose thermal conductivity is enhanced by mixing a high density inorganic filler with a resin composition. It has been difficult practically to produce an insulating substrate that includes holes and has high thermal conductivity. However, the method of the present invention can achieve such an insulating substrate easily. Moreover, a double sided circuit board that includes through holes formed by plating the holes can be produced easily as well. Further, a circuit board with improved strength and thermal conductivity can be produced by including a reinforcing material.

The present invention can provide a circuit board capable of having high thermal conductivity, maintaining sufficient strength, and carrying a large current. A power conversion module mounted on the circuit board of the present invention can have excellent thermal dissipation and suppress the temperature rise of its components. Thus, it is possible to use a large current, to mount components with high density, and to achieve small high-density equipment.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit board comprising:
   an insulating substrate obtained by curing a thermal conductive resin composition, the thermal conductive resin composition comprising (a) 70 to 95 weight % of an inorganic filler and (b) 5 to 30 weight % of a resin composition that comprises a thermosetting resin in an uncured state, a thermoplastic resin, and a latent curing agent,
   wherein a circuit pattern is formed on at least one surface of the insulating substrate, and holes are formed to penetrate both surfaces of the insulating substrate, and
   10 to 100 parts by weight of the thermoplastic resin are present with respect to 100 parts by weight of the thermosetting resin.

2. The circuit board according to claim 1, wherein the insulating substrate is obtained by curing the thermal conductive resin composition in the presence of a reinforcing material comprising at least one selected from a ceramic fiber and a glass fiber.

3. The circuit board according to claim 1, wherein the thermoplastic resin is at least one selected from the group consisting of polyvinyl chloride, polymethyl methacrylate, polyethylene, polystyrene and polyvinyl acetate.

4. The circuit board according to claim 1, wherein the thermosetting resin is at least one selected form the group consisting of bisphenol A epoxy resin, bisphenol F epoxy resin, bisphenol AD epoxy resin and phenol novolac epoxy resin.

5. The circuit board according to claim 1, wherein the resin composition further comprises a coupling agent.

6. The circuit board according to claim 5, wherein the coupling agent is at least one selected from the group consisting of an epoxysilane coupling agent, an aminosilane coupling agent and a titanate coupling agent.

7. A circuit board precursor comprising:
   an insulating substrate to be cured, comprising a thermal conductive resin composition, the thermal conductive resin composition comprising (a) 70 to 95 weight % of an inorganic filler and (b) 5 to 30 weight % of a resin composition that comprises a thermosetting resin in an uncured state, a thermoplastic resin, and a latent curing agent,
   wherein a circuit pattern is formed on at least one surface of the insulating substrate, and holes are formed to penetrate both surfaces of the insulating substrate, and
   10 to 100 parts by weight of the thermoplastic resin are present with respect to 100 parts by weight of the thermosetting resin.

\* \* \* \* \*